United States Patent
Chen et al.

(10) Patent No.: US 10,779,439 B2
(45) Date of Patent: Sep. 15, 2020

(54) REMOTE HEAT EXCHANGER

(71) Applicant: QUANTA COMPUTER INC., Taoyuan (TW)

(72) Inventors: Chao-Jung Chen, Taoyuan (TW); Yu-Nien Huang, Taoyuan (TW); Ching-Yu Chen, Taoyuan (TW); Erh-Kai Fang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/114,962

(22) Filed: Aug. 28, 2018

(65) Prior Publication Data

US 2019/0364697 A1 Nov. 28, 2019

Related U.S. Application Data

(60) Provisional application No. 62/676,075, filed on May 24, 2018.

(51) Int. Cl.
*H05K 7/20* (2006.01)

(52) U.S. Cl.
CPC ....... *H05K 7/20727* (2013.01); *H05K 7/2039* (2013.01)

(58) Field of Classification Search
None
See application file for complete search history.

(56) References Cited

U.S. PATENT DOCUMENTS

| 5,329,436 A | 7/1994 | Chiu |
| 5,486,982 A * | 1/1996 | Hsu .......................... G06F 1/183 |
| | | 312/223.1 |
| 6,137,683 A * | 10/2000 | Lee ..................... F28D 15/0266 |
| | | 165/185 |

(Continued)

FOREIGN PATENT DOCUMENTS

| CN | 1707395 A | 12/2005 |
| CN | 201535493 U | 7/2010 |

(Continued)

OTHER PUBLICATIONS

Extended European Search Report for EP Application No. 19157947.3, dated Aug. 13, 2019.

(Continued)

*Primary Examiner* — Courtney L Smith
(74) *Attorney, Agent, or Firm* — Nixon Peabody LLP

(57) ABSTRACT

An apparatus for cooling an electronic component is provided. The apparatus includes a heat-absorbing base configured to contact the electronic component within a server device and a heat-dissipating body connected to the heat-absorbing base. The heat-dissipating body includes a heat-dissipating static feature and at least one heat-dissipating dynamic feature. The at least one heat-dissipating dynamic feature is configured to be repositioned about the heat-dissipating static feature to increase a surface area of the heat-dissipating body. Using hinge device and flexible metal conduit connect and transfer heat to them (dynamic and static feature). This apparatus will follow currently assembly process and also not impact the other device assembly method. The more space we have inside the product the more heat we can solve.

20 Claims, 6 Drawing Sheets

(56) References Cited

U.S. PATENT DOCUMENTS

| | | | | |
|---|---|---|---|---|
| 7,298,619 | B1* | 11/2007 | Malone | H05K 7/1421 |
| | | | | 165/80.2 |
| 8,649,178 | B2* | 2/2014 | Huang | H01L 23/36 |
| | | | | 361/679.54 |
| 9,668,334 | B2* | 5/2017 | Refai-Ahmed | H05K 1/0203 |
| 2006/0023423 | A1 | 2/2006 | Kuo et al. | |
| 2008/0130221 | A1* | 6/2008 | Varadarajan | G06F 1/203 |
| | | | | 361/679.52 |
| 2008/0302509 | A1 | 12/2008 | Chen et al. | |
| 2013/0194747 | A1* | 8/2013 | Nagasawa | H05K 7/20336 |
| | | | | 361/690 |
| 2016/0165757 | A1* | 6/2016 | Norton | H01L 23/3672 |
| | | | | 165/80.4 |
| 2019/0041922 | A1* | 2/2019 | Kurma Raju | G06F 1/203 |

FOREIGN PATENT DOCUMENTS

| | | |
|---|---|---|
| CN | 201575736 U | 9/2010 |
| CN | 203232979 U | 10/2013 |
| CN | 203554868 U | 4/2014 |
| CN | 206557699 U | 10/2017 |
| EP | 1742262 A2 | 1/2007 |
| JP | H01171040 U | 12/1989 |
| JP | H04125455 U | 11/1992 |
| JP | 2007114656 A | 5/2007 |
| JP | 2007155285 A | 6/2007 |
| TW | 201043903 A | 12/2010 |
| TW | 201314425 A | 4/2013 |
| WO | 0141520 A1 | 6/2001 |
| WO | 03088022 A1 | 10/2003 |

OTHER PUBLICATIONS

TW Office Action for Application No. 108101874, dated Jun. 24, 2019, w/ First Office Action Summary.
TW Search Report for Application No. 108101874, dated Jun. 24, 2019, w/ First Office Action.
JP Office Action for Application No. 2019-060134, dated Mar. 24, 2020, w/ First Office Action Summary.
CN Office Action for Application No. 201910098168.3, dated Apr. 20, 2020, w/ First Office Action Summary.
CN Search Report for Application No. 201910098168.3, dated Apr. 20, 2020, w/ First Office Action.
CN Office Action for Application No. 201910098168.3, dated Jul. 3, 2020, w/ Second Office Action Summary.
CN Search Report for Application No. 201910098168.3, dated Jul. 3, 2020, w/ Second Office Action.
JP Office Action for Application No. 2019-060134, dated Aug. 4, 2020, w/ Second Office Action Summary.

* cited by examiner

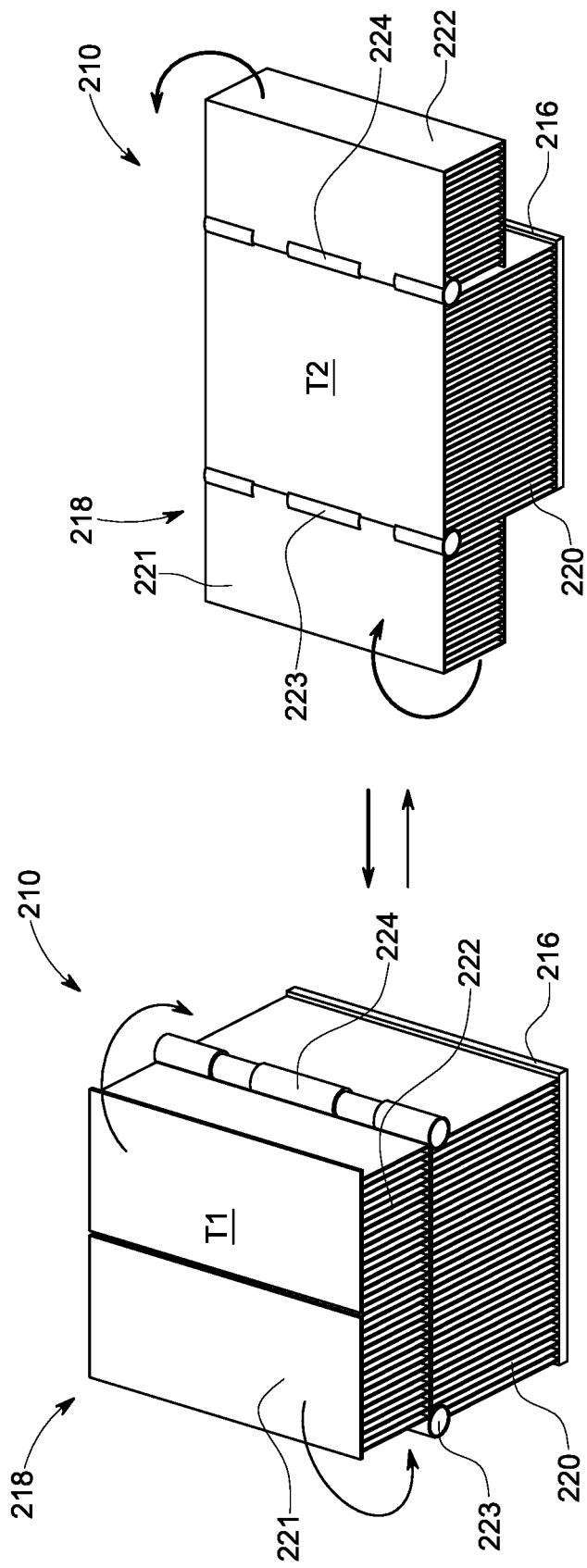

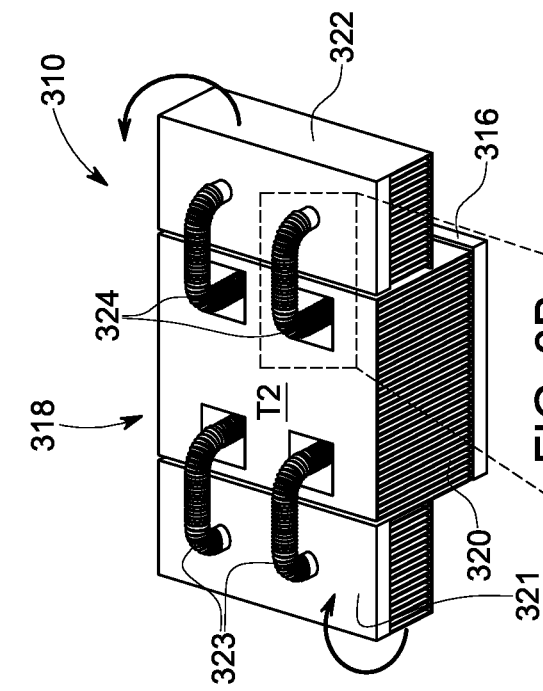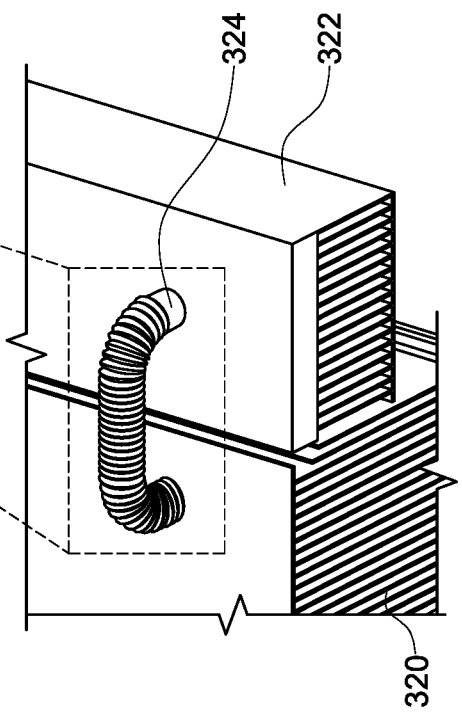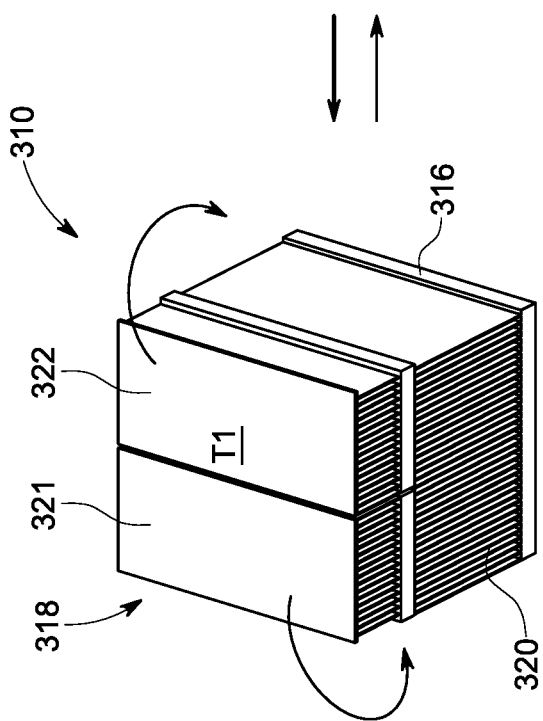

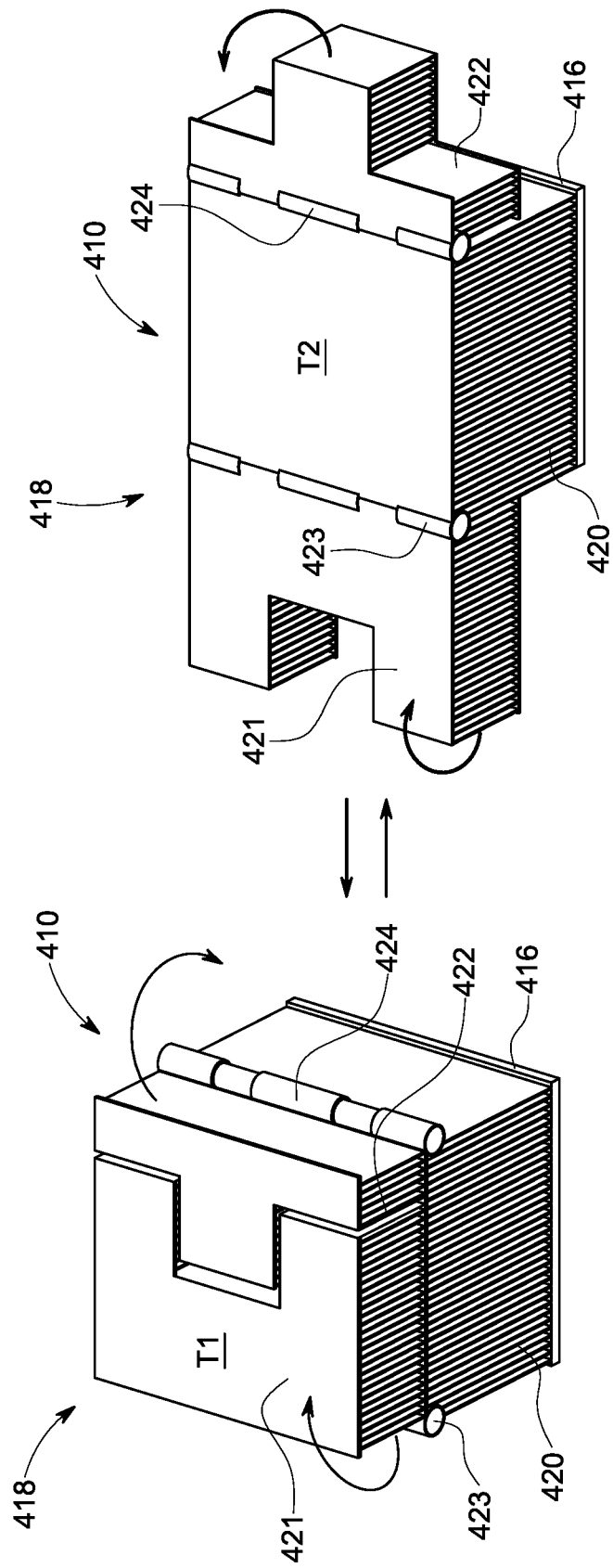

REMOTE HEAT EXCHANGER

CROSS REFERENCE TO RELATED APPLICATIONS

This application claims priority under 35 U.S.C. § 119 to U.S. Provisional Application No. 62/676,075, entitled "FLIPPABLE RHE APPLICATION FOR CPU/GPU THERMAL SOLUTION", and filed on May 25, 2018. The contents of that application are hereby incorporated by reference in their entirety.

FIELD OF THE INVENTION

The present invention relates to apparatuses for dissipating heat that emanates from individual electronic units within a server device.

BACKGROUND

The rapid increase in data storage and high bandwidth communication driven by Internet expansion is increasing the need for dense interconnection systems in data centers. These data centers are typically composed of rows of racks of servers. These servers need to be in high-bandwidth communication with other servers in the data centers. The high-bandwidth communication can be supported by either shielded electrical cables or increasingly active optical cables. Active optical cables support longer transmission distances and higher transmission bandwidths. An active optical cable typically has an optical engine incorporated into a transceiver on at least one end of the cable. The optical engine transforms electrical signals into optical signals (transmission [Tx] function), and transforms optical signals into electrical signals (receiver [Rx] function). An electronics rack can have hundreds or even thousands of interconnections, each of which generating heat that must be removed from the electronics rack. The inability to remove this heat can result in accelerated aging and/or premature failure of the interconnection of other components in the electronics rack. Therefore, there is a need to provide a cooling system in high speed communication devices that facilitates high-heat removal and dense packaging of the interconnections.

SUMMARY

Embodiments of the disclosure concern an apparatus for cooling an electronic component. The apparatus includes a heat-absorbing base configured to contact the electronic component within a server device and a heat-dissipating body connected to the heat-absorbing base. The heat-dissipating body includes a heat-dissipating static feature and at least one heat-dissipating dynamic feature. The at least one heat-dissipating dynamic feature is configured to be repositioned about the heat-dissipating static feature to increase a surface cooling area of the heat-dissipating body.

In some embodiments of the disclosure, the heat-dissipating static feature and the heat-dissipating dynamic feature includes a highly thermal conductivity material that is selected from a group of aluminum, copper metal, alloys, or composite materials.

In some embodiments of the disclosure, the heat-dissipating dynamic feature is configured to rotate about the heat-dissipating static feature via a first hinge device that connects the heat-dissipating dynamic feature with the heat-dissipating static feature and supports to transfer heat. In some embodiments of the disclosure, the rotation of the heat-dissipating dynamic feature about the heat-dissipating static feature creates an interlocking mating feature between the heat-dissipating dynamic feature and the heat-dissipating static feature.

The apparatus can also include a second heat-dissipating dynamic feature configured to be repositioned about the heat-dissipating static feature to increase a surface cooling area of the heat-dissipating body. In some embodiments of the disclosure, the second heat-dissipating dynamic feature is configured to rotate about the heat-dissipating static feature via a second hinge device that connects the second heat-dissipating dynamic feature with the heat-dissipating static feature and supports to transfer heat.

In some embodiments of the disclosure, the rotation of the second heat-dissipating dynamic feature about the heat-dissipating static feature creates an interlocking mating feature between the second heat-dissipating dynamic feature and the heat-dissipating static feature. In some embodiments of the disclosure, the second heat-dissipating dynamic feature is configured to rotate about the heat-dissipating static feature via a set of thermosiphons that connect the second heat-dissipating dynamic feature with the heat-dissipating static feature. In some embodiments of the disclosure, the set of thermosiphons includes a heat container that circulates a fluid.

In some embodiments of the disclosure, the heat-dissipating dynamic feature and the second heat-dissipating dynamic feature include a rectangular shape. It should be noted that the heat-dissipating dynamic feature can include or geometrical shapes based on the product housed within the apparatus.

In some embodiments of the disclosure, the heat-dissipating dynamic feature includes an interlocking feature, and the second heat-dissipating dynamic feature includes a corresponding interlocking feature configured to receive the interlocking feature of the heat-dissipating dynamic.

In some embodiments of the disclosure, the heat-dissipating dynamic feature is configured to rotate about the heat-dissipating static feature via a second set of thermosiphons that connects the heat-dissipating dynamic feature with the heat-dissipating static feature. In some embodiments of the disclosure, the second set of thermosiphons includes a heat container that circulates a fluid.

Embodiments of the disclosure concern a server device having an inlet side, an outlet side, a first sidewall, and a second sidewall, where the first sidewall and the second sidewall extend from the inlet side to the outlet side. The server device includes a fan module configured to draw airflow in from the inlet side and out to the outlet side, and a chipset configured to receive a cooling assembly. The cooling assembly includes a heat-absorbing base configured to contact the chipset and a heat-dissipating body connected to the heat-absorbing base. The heat-dissipating body includes a heat-dissipating static feature, a first heat-dissipating dynamic feature, and a second heat-dissipating dynamic feature. The first heat-dissipating dynamic feature and the second heat-dissipating dynamic feature are configured to rotate about the heat-dissipating static feature to increase a surface area of the heat-dissipating body.

Additional features and advantages of the disclosure will be set forth in the description that follows, and in part, will be obvious from the description; or can be learned by practice of the principles disclosed herein. The features and advantages of the disclosure can be realized and obtained by means of the instruments and combinations particularly pointed out in the appended claims. These and other features of the disclosure will become fully apparent from the following description and appended claims, or can be learned by the practice of the principles set forth herein.

BRIEF DESCRIPTION OF THE DRAWINGS

In order to describe the manner in which the above-recited disclosure and its advantages and features can be obtained, a more particular description of the principles described above will be rendered by reference to specific examples illustrated in the appended drawings. These drawings depict only example aspects of the disclosure, and are therefore not to be considered as limiting of its scope. These principles are described and explained with additional specificity and detail through the use of the following drawings.

FIG. 2A illustrates a cooling assembly in a closed position, according to one or more embodiments of the disclosure;

FIG. 2B illustrates a cooling assembly in an opened position, according to one or more embodiments of the disclosure;

FIG. 3A illustrates a cooling assembly in a closed position, according to one or more embodiments of the disclosure;

FIG. 3B illustrates a cooling assembly in an opened position, according to one or more embodiments of the disclosure;

FIG. 3C illustrates exemplary thermosiphon connectors implemented in the cooling assembly of FIG. 3B, according to one or more embodiments of the disclosure;

FIG. 4A illustrates a cooling assembly with different geometry in a closed position, according to one or more embodiments of the disclosure;

FIG. 4B illustrates a cooling assembly with different geometry in an opened position, according to one or more embodiments of the disclosure;

DETAILED DESCRIPTION

Figure 1:
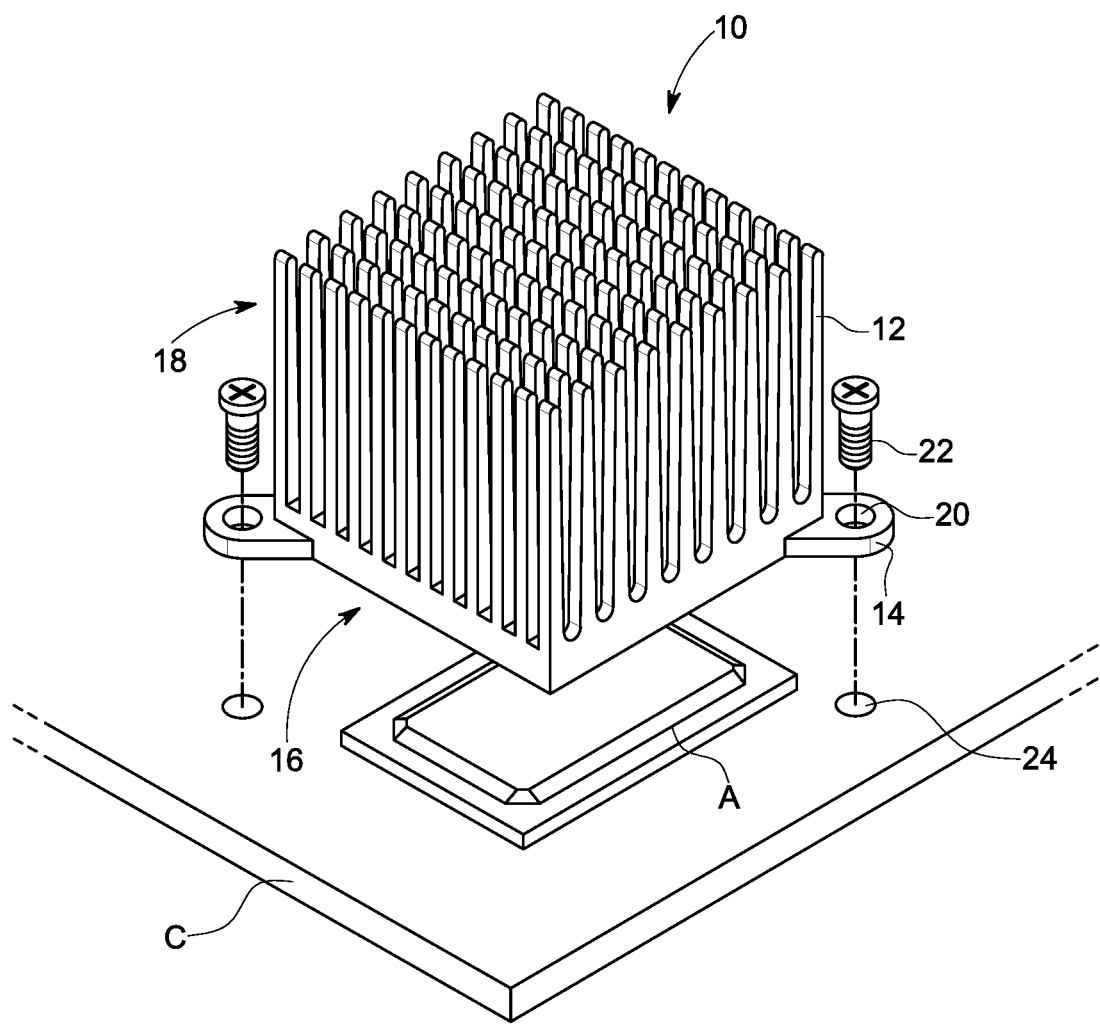
FIG. 1 is a perspective view of a conventional heatsink for cooling a chipset.

The present invention is described with reference to the attached figures, where like reference numerals are used throughout the figures to designate similar or equivalent elements. The figures are not drawn to scale, and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

In the high-performance computing industry, a typical server device can include one or more high-performance chipsets. For example, a computing server can include a computer-processing unit (CPU) or a graphics-processing unit (GPU). These chipsets can generate heat and/or have interconnections that generate heat. As indicated above, the inability to remove this heat can result in accelerated aging and/or premature failure of the chipset itself, or the interconnection of other components in the computing server. In typical computing servers, a heat sink exchanger can be attached directly on top of a high-performance chip set to try alleviate the heating issues discussed above.

FIG. 1 is a perspective view of a conventional heatsink 10 for cooling a chipset A. The chipset A can be mounted on a printed circuit board C. The conventional heatsink 10 includes a heat-absorbing base 16 and a heat-dissipating feature 18. The heat-absorbing base 16 includes two installation features 14 at its corners. The installation features 14 enable the heat-absorbing base 16 to be mounted to contact the top surface of the chipset A mounted on a printed circuit board C. For example, the installation features 14 include apertures 20 configured to receive screws 22. The printed circuit board C can have installation holes 24 configured to secure screws 22. As shown in FIG. 1, two installation holes 24 are formed near the chipset A. The heat-dissipating feature 18 can extend from the heat-absorbing base 16 upward to transfer heat absorbed by the heat-absorbing base 16 to the air. The heat-dissipating feature 18 includes heat dissipating fins 12.

In some embodiments, the printed circuit board C can have multiple chipsets A. The printed circuit board C can be located within a server device (not shown). Aa a result, the server device can include multiple chipsets A and accompanying heatsinks 10. In typical server devices, fan modules are mounted adjacent to the heatsink 10 such that the fans direct forced air over the heatsink 10. Air preferably flows in one or more air-flow paths between the heat dissipating fins 12. The heatsink 10 is traditionally made of aluminum, copper metal, heat pipes or vapor chambers. The heatsink 10 can have a specific dimension that corresponds with the dimensions of the chipset A. Typically, a heatsink is designed to maximize its surface area in contact with the cooling medium surrounding it, such as airflow. The air velocity, choice of material, protrusion design, and surface treatment are factors that affect the performance of the heatsink. The surface area of the heatsink 10 is limited to that of the dissipating fins 12.

As the demand for high-powered chipsets increases, the need for high-efficiency heatsinks increase as well. As indicated above, when performance demand increases the heat generated by the chipsets within the server device increases. Excessive temperatures can lead to premature failure and poor performance. Thus, the various embodiments disclosed herein provide a new heatsink design with increased surface areas, yet still maintain densely packaged high-performance chipsets. Specifically, the present disclosure teaches a cooling mechanism that includes a heat-absorbing base configured to contact the high-powered chipset and a heat-dissipating body connected to the heat-absorbing base. The heat-dissipating body includes a heat-dissipating static feature, a first heat-dissipating dynamic feature and a second heat-dissipating dynamic feature. The first heat-dissipating dynamic feature and the second heat-dissipating dynamic feature are configured to rotate about the heat-dissipating static feature to increase a surface area of the heat-dissipating body.

FIG. 2A illustrates a cooling assembly 210 according to one or more embodiments of the disclosure. The cooling assembly 210 can include a heat-absorbing base 216 and a heat-dissipating body 218. The cooling assembly 210 can be made of aluminum, copper metal, alloys, composite materials, heat pipes, or vapor chambers, for example. Other heat-conducting materials can also be implemented herein. The shape of the heat-dissipating body 218 can be modified to create more surface area to increase the air-flow paths and improve the efficiency of the cooling assembly 210.

Figure 5A:
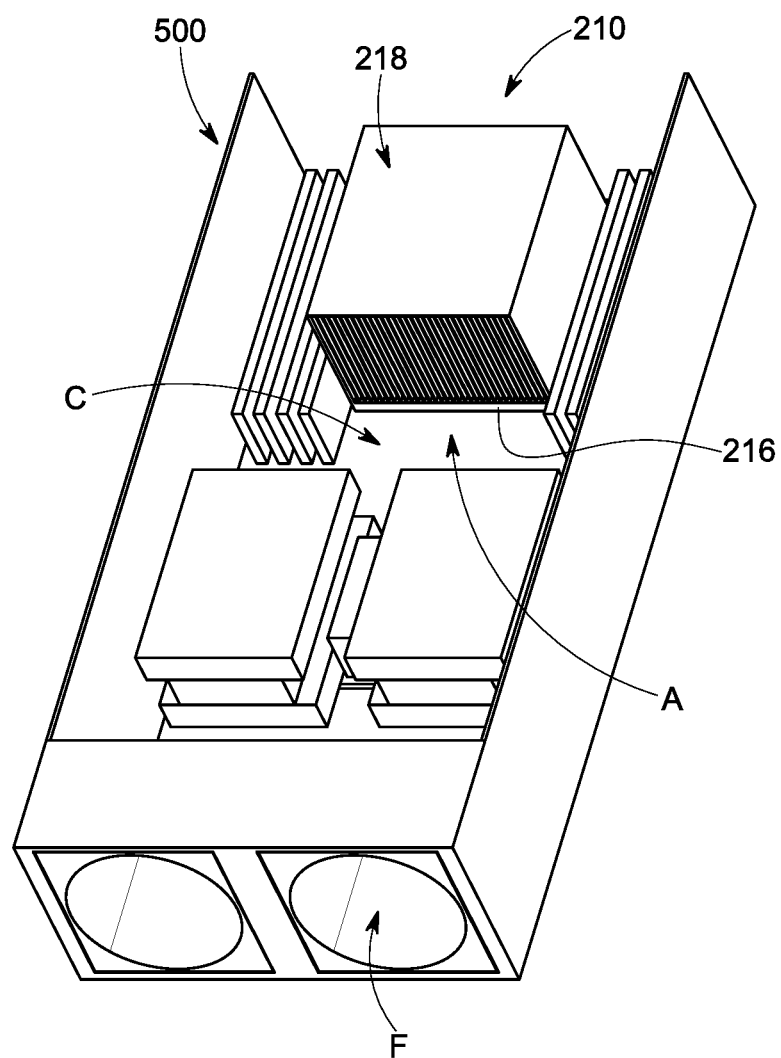
FIG. 5A shows a server device with a cooling assembly installed according to one or more embodiments of the disclosure.

Referring momentarily to FIG. 5A, the cooling assembly 210 can be configured to contact a top surface of a chipset A. The chipset A can be printed on a circuit board C (in FIG. 1) within a server device 500. The heat drawn from the chipset can be sent through the heat-absorbing base 216 into the heat-dissipating body 218. Fan modules F can be mounted adjacent to the cooling assembly 210 such that the fans direct forced air over the heat-dissipating body 218.

Referring back to FIG. 2A, the heat-dissipating body 218 can include a heat-dissipating static feature 220, a first heat-dissipating dynamic feature 221, and a second heat-dissipating dynamic feature 222. The first heat-dissipating dynamic feature 221 can be connected to the heat-dissipating static feature 220 at a first hinge 223. Similarly, the second heat-dissipating dynamic feature 222 can be connected to the heat-dissipating static feature 220 at a second hinge 224. While the cooling assembly 210 incorporates hinge assemblies 223 and 224 to dynamically rotate the first and second heat-dissipating dynamic features 221 and 222, other mechanical features can be incorporated. Other exemplary embodiments are discussed in detail with respect to FIGS. 3A-3C.

FIG. 2A exemplifies the cooling assembly 210 in the closed position. The top surface T1 of the cooling assembly 210 in the closed position is limited to the dimension of the first and second heat-dissipating dynamic features 221 and 222 stacked upon the heat-dissipating static feature 220. In other words, the top surface T1 of the cooling assembly 210 is equal to the width of the heat-dissipating static feature 220, squared.

In the closed position, the bottom surface of the first heat-dissipating dynamic feature 221 contacts a portion of the top surface of the heat-dissipating static feature 220. In this way, any heat generated from the chipset (not shown) can travel through the heat-absorbing base 216 into the heat-dissipating static feature 220, and further into the first heat-dissipating dynamic feature 221 at the mating surfaces. Furthermore, in the closed position, the bottom surface of the second heat-dissipating dynamic feature 222 contacts a portion of the top surface of the heat-dissipating static feature 220. In this way, any heat generated from the chipset (not shown) can travel through the heat-absorbing base 216 into the heat-dissipating static feature 220, and further into the second heat-dissipating dynamic feature 222 at the mating surfaces. While the heat-dissipating body 218 provides the surface areas of a cube, the first and second heat-dissipating dynamic features 221 and 222 can be positioned to an open position. In this position, the number of surface areas is increased to improve the efficiency of the cooling assembly 210.

In some embodiments, the mating surfaces can be two flat surfaces between the heat-dissipating static feature 220 and the first heat-dissipating dynamic feature 221. In alternative embodiments, the mating surfaces can be two interlocking surfaces between the heat-dissipating static feature 220 and the first heat-dissipating dynamic feature 221. Similarly, the mating surfaces can be two flat surfaces between the heat-dissipating static feature 220 and the second heat-dissipating dynamic feature 222. In alternative embodiments, the mating surfaces can be two interlocking surfaces between the heat-dissipating static feature 220 and the second heat-dissipating dynamic feature 222. With interlocking surfaces, the surface area between the two mating pieces can be increased, improving the efficiency of the cooling assembly 210. The interlocking surfaces can include interlocking teeth.

The mating surfaces can also include a separate conducting material from the heat-dissipating static feature 220 and the first heat-dissipating dynamic feature 221. In some embodiments, the mating surfaces can include the same material as the heat-dissipating static feature 220 and the first heat-dissipating dynamic feature 221. Similarly, the mating surfaces can also include a separate conducting material from the heat-dissipating static feature 220 and the second heat-dissipating dynamic feature 222. In some embodiments, the mating surfaces can include the same material as the heat-dissipating static feature 220 and the second heat-dissipating dynamic feature 222.

FIG. 2B illustrates the chipset cooling assembly 210 in the open position, according to one or more embodiments of the disclosure. In some embodiments, the cooling assembly 210 can be configured into the open position manually. In alternative embodiments, the cooling assembly 210 can be configured into the open position automatically. For example, the cooling assembly 210 can be equipped with a temperature sensor. The temperature sensor can detect whether the ambient temperature or the temperature of the chipset has exceeded a predetermined threshold. Upon exceeding the threshold temperature, the cooling assembly 210 can be actuated into the open position. Furthermore, the cooling assembly 210 can be connected to an administrator (not shown) over a wide-area-network (WAN) or a local-area-network (LAN). The administrator can actuate the cooling assembly 210 upon determining that the chipset has exceeded a threshold temperature. Other manual or automatic implementations can be incorporated herein.

In the opened position, a side surface of the first heat-dissipating dynamic feature 221 rotates inward to contact a portion of the side surface of the heat-dissipating static feature 220. In this way, any heat generated from the chipset (not shown) can travel through the heat-absorbing base 216 into the heat-dissipating static feature 220, and further into the first heat-dissipating dynamic feature 221 at the mating surfaces. Similarly, in the open position, the side surface of the second heat-dissipating dynamic feature 222 contacts a portion of the side surface of the heat-dissipating static feature 220. In this way, any heat generated from the chipset (not shown) can travel through the heat-absorbing base 216 into the heat-dissipating static feature 220 and further into the second heat-dissipating dynamic feature 222 at the mating surfaces. Moreover, the top surface of the heat-dissipating body 218 is now increased by rotating the first and second heat-dissipating dynamic features 221 and 222 outward.

Figure 5B:
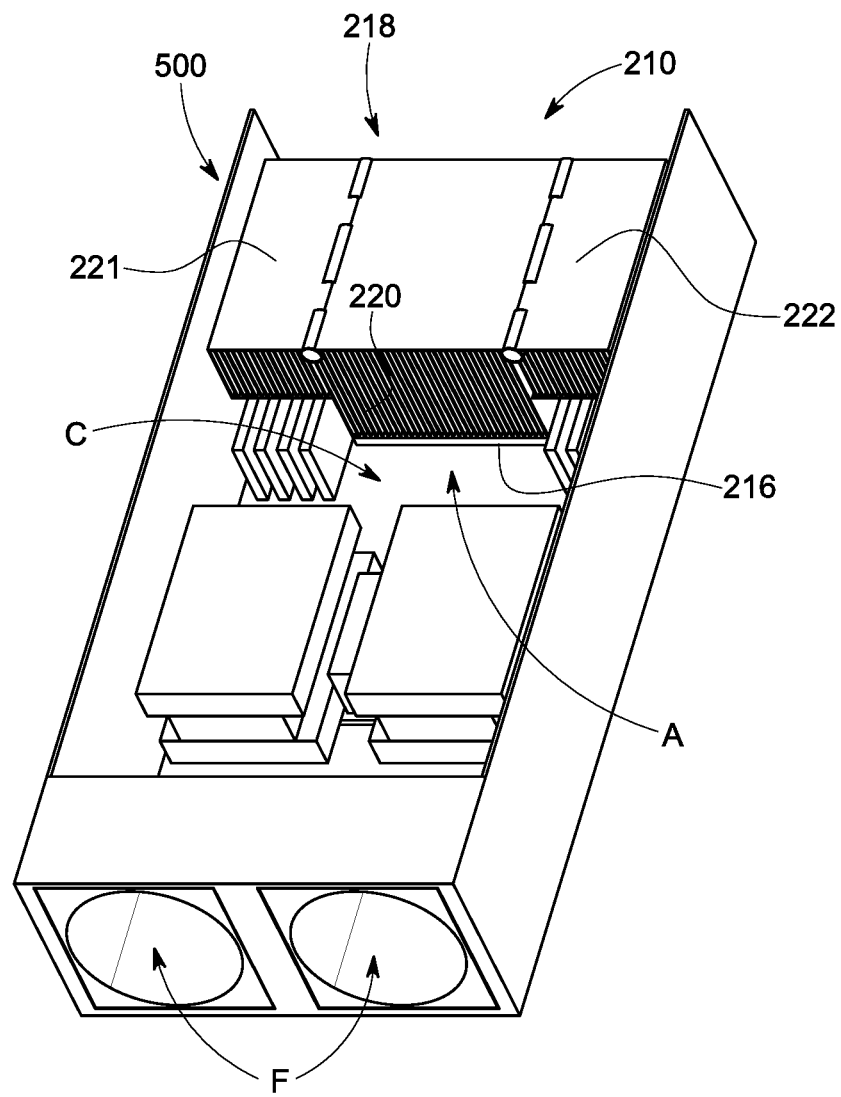
FIG. 5B shows the server device of FIG. 5A with a cooling assembly in an open position installed according to one or more embodiments of the disclosure.

Referring momentarily to FIG. 5B, the cooling assembly 210 can be configured into the open position within the server device 500. The top surface T2 (in FIG. 2B) of the cooling assembly 210 in the opened position is twice the size of the top surface T1 (in FIG. 2A) of the cooling assembly in the closed position. Specifically, the top surface T2 of the cooling assembly 210 equals to the width of the heat-dissipating static feature 220, squared, plus the top surfaces of the first and second heat-dissipating dynamic features 221 and 222. The heat drawn from the chipset A can be sent through the heat-absorbing base 216 into the heat-dissipating body 218, and out through the first and second heat-dissipating dynamic features 221 and 222. Fan modules F can be mounted adjacent to the cooling assembly 210 such that the fans direct forced air over the top surface T2 of the cooling assembly 210. The increased surface area improves the efficiency of the cooling assembly 210 as the forced air directed from the fan modules F has more surface space to contact the cooling assembly 210.

FIG. 3A illustrates a cooling assembly 310 in a closed position according to one or more embodiments of the disclosure. The cooling assembly 310 can include a heat-absorbing base 316 and a heat-dissipating body 318. The cooling assembly 310 can be made of aluminum, copper metal, alloys, composite materials, heat pipes, or vapor chambers, for example. In some embodiments, the cooling assembly 310 can be made from multiple materials. For example, the cooling assembly 310 can include thermosiphons that interconnect the components of the heat-dissipating body 318. This is discussed in greater detail below with respect to FIGS. 3B and 3C. Other heat-conducting materials can also be implemented herein. Similar to the cooling assembly 210 of FIG. 2, the shape of the heat-dissipating body 318 can be modified to create more surface area to increase the air-flow paths and improve the efficiency of the cooling assembly 310.

The heat-dissipating body 318 can include a heat-dissipating static feature 320, a first heat-dissipating dynamic feature 321, and a second heat-dissipating dynamic feature 322. The top surface T1 of the cooling assembly 310 in the closed position is limited to the dimension of the first and second heat-dissipating dynamic features 321 and 322 stacked upon the heat-dissipating static feature 320. In other words, the top surface T1 of the cooling assembly 310 equals to the width of the heat-dissipating static feature 320, squared. In the closed position, the bottom surface of the first heat-dissipating dynamic feature 321 contacts a portion of the top surface of the heat-dissipating static feature 320. In this way, any heat generated from the chipset (not shown) can travel through the heat-absorbing base 316 into the heat-dissipating static feature 320 and further into the first heat-dissipating dynamic feature 321. Furthermore, in the closed position, the bottom surface of the second heat-dissipating dynamic feature 322 contacts a portion of the top surface of the heat-dissipating static feature 320. In this way, any heat generated from the chipset (not shown) can travel through the heat-absorbing base 316 into the heat-dissipating static feature 320 and further into the second heat-dissipating dynamic feature 322. While the heat-dissipating body 318 provides the surface area of a cube, the cooling assembly 310 can be positioned to an open position where the number of surface areas are increased to improve the efficiency of the cooling assembly 210 (cite).

FIG. 3B illustrates the chipset cooling assembly 310 in the open position, according to one or more embodiments of the disclosure. The first heat-dissipating dynamic feature 321 can be connected to the heat-dissipating static feature 320 at a first set of thermosiphons 323. The first set of thermosiphons 323 can be mechanical feature that functions as both a heat exchanger and a hinge. For example, the first set of thermosiphons 323 can circulate fluid between first heat-dissipating dynamic feature 321 and the heat-dissipating static feature 320. When the fluid reaches a certain temperature, the first set of thermosiphons 323 can expand, causing the first heat-dissipating dynamic feature 321 to rotate about the heat-dissipating static feature 320. The first set of thermosiphons 323 can be heat pipes, which circulates a fluid without the necessity of a mechanical pump. Alternatively, the first set of thermosiphons 323 can be made of a single heat-conducting material similar to the heat-dissipating body 318. In some embodiments, the first set of thermosiphons 323 can be actuated by a motor.

Similarly, the second heat-dissipating dynamic feature 322 can be connected to the heat-dissipating static feature 320 at a second set of thermosiphons 324. The second set of thermosiphons 324 can be a mechanical feature that functions as both a heat exchanger and a hinge. For example, the second set of thermosiphons 324 can circulate fluid between second heat-dissipating dynamic feature 322 and the heat-dissipating static feature 320. When the fluid reaches a certain temperature, the second set of thermosiphons 324 can expand, causing the second heat-dissipating dynamic feature 322 to rotate about the heat-dissipating static feature 320. The second set of thermosiphons 324 can be heat pipes, which circulates a fluid without the necessity of a mechanical pump. Alternatively, the second set of thermosiphons 324 can be made of a single heat-conducting material similar to the heat-dissipating body 318. Referring momentarily to FIG. 3C, the second set of thermosiphons 324 can be connected directly into the second heat-dissipating dynamic feature 322. The second set of thermosiphons 324 can be made from the same materials as the second heat-dissipating dynamic feature 322, the heat-dissipating static feature 320, or both components. In some embodiments, the second set of thermosiphons 324 can be actuated by a motor. The thermosiphons 323 and 324 can be made up of a flexible metal conduit.

Referring back to FIG. 3B, in the opened position, a side surface of the first heat-dissipating dynamic feature 321 rotates inward to contact a portion of the side surface of the heat-dissipating static feature 320. In this way, any heat generated from the chipset (not shown) can travel through the heat-absorbing base 316 into the heat-dissipating static feature 320, and further into the first heat-dissipating dynamic feature 321. Similarly, in the opened position, the side surface of the second heat-dissipating dynamic feature 322 contacts a portion of the side surface of the heat-dissipating static feature 320. In this way, any heat generated from the chipset (not shown) can travel through the heat-absorbing base 316 into the heat-dissipating static feature 320 and further into the second heat-dissipating dynamic feature 322. Moreover, the top surface of the heat-dissipating body 318 is now increased by the rotating the first and second heat-dissipating dynamic features 321 and 322 outward. It should be understood that embodiments of the disclosure may only include a single heat-dissipating dynamic feature, or more than two heat-dissipating dynamic features.

In alternative embodiments, the first and second heat-dissipating dynamic features 321 and 322 can be extended vertically from the heat-dissipating static feature 320. In some embodiments, the first and second heat-dissipating dynamic features 321 and 322 can be configured to move in multiple directions about the heat-dissipating static feature 320. It should be understood that the first and second heat-dissipating dynamic features 321 and 322 can be rotated, slid, or extended from the heat-dissipating static feature 320 in other directions and by other mechanisms to increase the surface area of the cooling assembly 310.

The top surface T2 of the cooling assembly 310 in the opened position is twice the size of the top surface T1 (in FIG. 3A) of the cooling assembly 310 in the closed position. Specifically, the top surface T2 of the cooling assembly 310 equals to the width of the heat-dissipating static feature 320, squared, plus the top surfaces of both the first and second heat-dissipating dynamic features 321 and 322. The increased surface area improves the efficiency of the cooling assembly 310. While the cooling assembly 310 incorporates rectangular first and second heat-dissipating dynamic features 321 and 322, other geometrically-shaped components can be incorporated.

FIG. 4A illustrates a chipset cooling assembly 410 according to one or more embodiments of the disclosure. The cooling assembly 410 can include a heat-absorbing base 416 and a heat-dissipating body 418. The cooling assembly 410 can be made of aluminum, copper metal, alloys, composite materials, heat pipes, or vapor chambers, for example. Other heat-conducting materials can also be implemented herein. The shape of the heat-dissipating body 418 can be modified to create more surface area to increase the air-flow paths and improve the efficiency of the cooling assembly 410.

The heat-dissipating body 418 can include a heat-dissipating static feature 420, a first heat-dissipating dynamic feature 421, and a second heat-dissipating dynamic feature 422. The first heat-dissipating dynamic feature 421 can be connected to the heat-dissipating static feature 420 at a first hinge 423. Similarly, the second heat-dissipating dynamic feature 422 can be connected to the heat-dissipating static feature 420 at a second hinge 424. Noticeably, the surface area of the first heat-dissipating dynamic feature 421 is larger than the surface area of the second heat-dissipating dynamic feature 422. The first heat-dissipating dynamic feature 421 has a u-shape, configured to secure the inverted shape of the second heat-dissipating dynamic feature 422. While the first heat-dissipating dynamic feature 421 has a squared-u-shape, other shapes can be considered. For example, the first heat-dissipating dynamic feature 421 has a semi-circle u-shape, configured to secure an inverted semi-circle u-shape of the second heat-dissipating dynamic feature 422. In this configuration, the cooling assembly 410 provides more surface areas for airflow to make contact when in the open position. Other geometrical orientations can also be incorporated herein.

While FIG. 4A exemplifies the cooling assembly 410 in the closed position, FIG. 4B illustrates the cooling assembly 410 in the open position. The top surface T1 (in FIG. 4A) of the cooling assembly 410 in the closed position is limited to the dimension of the first and second heat-dissipating dynamic features 421 and 422 stacked upon the heat-dissipating static feature 420. In other words, the top surface T1 of the cooling assembly 410 equals to the width of the heat-dissipating static feature 420, squared.

In the closed position, the bottom surface of the first heat-dissipating dynamic feature 421 contacts a portion of the top surface of the heat-dissipating static feature 420. In this way, any heat generated from the chipset (not shown) can travel through the heat-absorbing base 416 into the heat-dissipating static feature 420 and further into the first heat-dissipating dynamic feature 421. Furthermore, in the closed position, the bottom surface of the second heat-dissipating dynamic feature 422 contacts a portion of the top surface of the heat-dissipating static feature 420. In this way, any heat generated from the chipset (not shown) can travel through the heat-absorbing base 416 into the heat-dissipating static feature 420 and further into the second heat-dissipating dynamic feature 422. While the heat-dissipating body 418 provides the surface areas of a cube, the first and second heat-dissipating dynamic features 421 and 422 can be positioned to an open position. In this position, the number of surface areas are increased to improve the efficiency of the cooling assembly 410.

FIG. 4B illustrates the chipset cooling assembly 410 in the open position, according to one or more embodiments of the disclosure. In the opened position, a side surface of the first heat-dissipating dynamic feature 421 rotates inward to contacts a portion of the side surface of the heat-dissipating static feature 420. In this way, any heat generated from the chipset (not shown) can travel through the heat-absorbing base 416 into the heat-dissipating static feature 420 and further into the first heat-dissipating dynamic feature 421 at the mating surfaces. Similarly, in the opened position, the side surface of the second heat-dissipating dynamic feature 422 contacts a portion of the side surface of the heat-dissipating static feature 420. In this way, any heat generated from the chipset (not shown) can travel through the heat-absorbing base 416 into the heat-dissipating static feature 420 and further into the second heat-dissipating dynamic feature 422 at the mating surfaces. Moreover, the top surface of the heat-dissipating body 418 is now increased by the rotating the first and second heat-dissipating dynamic features 421 and 422 outward.

The top surface T2 of the cooling assembly 410 in the opened position is twice the size of the top surface T1 of the cooling assembly 410 (in FIG. 4A) in the closed position. Specifically, the top surface T2 of the cooling assembly 410 equals to the width of the heat-dissipating static feature 420 squared plus the top surfaces of the first and second heat-dissipating dynamic features 421 and 422. Furthermore, because the first heat-dissipating dynamic feature 421 has a u-shape and the second heat-dissipating dynamic feature 422 has an inverted u-shape, the cooling assembly 410 provides more surface areas along the side for airflow to make contact when in the open position. The increased surface area improves the efficiency of the cooling assembly 410.

While particular embodiments of the present invention have been shown and described, it will be obvious to those skilled in the relevant arts that changes and modifications may be made without departing from the invention in its broader aspects. Therefore, the aim in the appended claims is to cover all such changes and modifications that fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

The terminology used herein is for the purpose of describing particular embodiments only and is not intended to limit the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. An apparatus for cooling an electronic component, the apparatus comprising:
a heat-absorbing base configured to contact the electronic component within a server device; and
a heat-dissipating body connected to the heat-absorbing base, wherein the heat-dissipating body comprises a heat-dissipating static feature and at least one heat-dissipating dynamic feature,
wherein, during operation of the electronic component, the at least one heat-dissipating dynamic feature is configured to be repositioned from a first state to a second state to provide an increased surface area exposure of the heat-dissipating body to surrounding air to dissipate more heat into the surrounding air.

2. The apparatus of claim 1, wherein the heat-dissipating static feature and the at least one heat-dissipating dynamic feature comprises a highly thermal conductivity material is selected from a group of aluminum, copper metal, alloys, or composite materials.

3. The apparatus of claim 1, wherein the at least one heat-dissipating dynamic feature is configured to rotate about the heat-dissipating static feature via a first hinge device that connects the at least one heat-dissipating dynamic feature with the heat-dissipating static feature and supports heat transfer to the heat-dissipating dynamic feature.

4. The apparatus of claim 3, wherein the rotation of the at least one heat-dissipating dynamic feature about the heat-dissipating static feature creates an interlocking mating feature between the at least one heat-dissipating dynamic feature and the heat-dissipating static feature.

5. The apparatus of claim 1, further comprising a second heat-dissipating dynamic feature configured to be repositioned about the heat-dissipating static feature to increase a surface cooling area of the heat-dissipating body.

6. The apparatus of claim 3, further comprising a second heat-dissipating dynamic feature configured to be repositioned about the heat-dissipating static feature to increase a surface cooling area of the heat-dissipating body, and wherein the second heat-dissipating dynamic feature is configured to rotate about the heat-dissipating static feature via a second hinge device that connects the second heat-dissipating dynamic feature with the heat-dissipating static feature and supports heat transfer to heat-dissipating dynamic feature.

7. The apparatus of claim 6, wherein the rotation of the second heat-dissipating dynamic feature about the heat-dissipating static feature creates an interlocking mating feature between the second heat-dissipating dynamic feature and the heat-dissipating static feature.

8. The apparatus of claim 5, wherein the second heat-dissipating dynamic feature is configured to rotate about the heat-dissipating static feature via a first set of thermosiphons that connects the second heat-dissipating dynamic feature with the heat-dissipating static feature.

9. The apparatus of claim 8, wherein the first set of thermosiphons comprises a heat pipe that circulates a fluid.

10. The apparatus of claim 5, wherein the at least one heat-dissipating dynamic feature and the second heat-dissipating dynamic feature comprise a rectangular shape.

11. The apparatus of claim 5, wherein the at least one heat-dissipating dynamic feature comprises an interlocking feature and the second heat-dissipating dynamic feature comprises a corresponding interlocking feature configured to receive the interlocking feature of the at least one heat-dissipating dynamic feature.

12. The apparatus of claim 8, wherein the at least one heat-dissipating dynamic feature is configured to rotate about the heat-dissipating static feature via a second set of thermosiphons that connects the at least one heat-dissipating dynamic feature with the heat-dissipating static feature.

13. The apparatus of claim 12, wherein the second set of thermosiphons comprises a heat container that circulates a fluid.

14. A server device having an inlet side, an outlet side, a first sidewall, and a second sidewall, where the first sidewall and the second sidewall extend from the inlet side to the outlet side, the server device comprising:
a fan module configured to draw airflow in from the inlet side to the outlet side; and
a chipset configured to receive a cooling assembly, wherein the cooling assembly comprises:
a heat-absorbing base configured to contact the chipset; and
a heat-dissipating body connected to the heat-absorbing base, wherein the heat-dissipating body comprises a heat-dissipating static feature and at least one heat-dissipating dynamic feature,
wherein, during operation of the chipset, the at least one heat-dissipating dynamic feature is configured to be repositioned from a first state to a second state to allow a total exposed surface area of the heat-dissipating body to surrounding air to be increased to dissipate more heat into the surrounding air.

15. The server device of claim 14, wherein the heat-dissipating static feature and the at least one heat-dissipating dynamic feature comprises a highly thermal conductivity material that is selected from a group of aluminum, copper metal, alloys, or composite materials.

16. The server device of claim 14, wherein the at least one heat-dissipating dynamic feature is configured to rotate about the heat-dissipating static feature via a first hinge device that connects the at least one heat-dissipating dynamic feature with the heat-dissipating static feature.

17. The server device of claim 16, wherein the rotation of the at least one heat-dissipating dynamic feature about the heat-dissipating static feature creates an interlocking mating feature between the at least one heat-dissipating dynamic feature and the heat-dissipating static feature.

18. The server device of claim 14, further comprising a second heat-dissipating dynamic feature configured to be repositioned about the heat-dissipating static feature to increase a surface area of the heat-dissipating body.

19. The server device of claim 18, wherein the second heat-dissipating dynamic feature is configured to rotate about the heat-dissipating static feature via a second hinge device connecting the second heat-dissipating dynamic feature and the heat-dissipating static feature.

20. The server device of claim 18, wherein the second heat-dissipating dynamic feature is configured to rotate about the heat-dissipating static feature via a set of thermosiphons that connects the second heat-dissipating dynamic feature with the heat-dissipating static feature.

* * * * *